(12) United States Patent
Ido et al.

(10) Patent No.: US 7,667,290 B2
(45) Date of Patent: Feb. 23, 2010

(54) SEMICONDUCTOR DEVICE INCLUDING A LASER LIGHT BLOCKING LAYER WHICH OVERLAPS FUSES

(75) Inventors: Yasuhiro Ido, Tokyo (JP); Takeshi Iwamoto, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 512 days.

(21) Appl. No.: 11/237,772

(22) Filed: Sep. 29, 2005

(65) Prior Publication Data

US 2006/0076642 A1  Apr. 13, 2006

(30) Foreign Application Priority Data

Sep. 30, 2004  (JP) .............................. 2004-285816

(51) Int. Cl.
*H01L 29/00* (2006.01)
(52) U.S. Cl. .............................. 257/529; 257/E23.114; 257/E23.149
(58) Field of Classification Search ................. 257/529, 257/530, 528, E23.114, E23.149, E23.15
See application file for complete search history.

(56) References Cited

U.S. PATENT DOCUMENTS

| 7,215,001 B2 * | 5/2007 | Kajita ......................... 257/529 |
| 2002/0063305 A1 * | 5/2002 | Koike ......................... 257/529 |
| 2004/0080022 A1 * | 4/2004 | Ido et al. ..................... 257/529 |

FOREIGN PATENT DOCUMENTS

| JP | 62-85442 | 4/1987 |
| JP | 2002-134616 | 5/2002 |

* cited by examiner

*Primary Examiner*—Matthew E Warren
(74) *Attorney, Agent, or Firm*—Oblon, Spivak, McClelland, Maier & Neustadt, L.L.P.

(57) ABSTRACT

The present invention provides a semiconductor device comprising: a substrate; a first insulating film formed on a principal surface of the substrate; a second insulating film formed on the first insulating film; a plurality of fuses formed on the second insulating film; and a blocking layer disposed in the first and second insulating films, the blocking layer being formed of a material capable of reflecting laser light irradiated to blow the plurality of fuses. The blocking layer overlaps a region in which the plurality of fuses are formed when viewed from the principal surface of the substrate. The plurality of fuses may be each formed in two or more insulating film layers laminated to one another on the second insulating film.

5 Claims, 8 Drawing Sheets

SEMICONDUCTOR DEVICE INCLUDING A LASER LIGHT BLOCKING LAYER WHICH OVERLAPS FUSES

BACKGROUND OF THE INVENTION

1. Field of the Invention

The present invention relates to a semiconductor device and a manufacturing method thereof, and more particularly to a semiconductor device which includes redundant circuitry having fuses therein.

2. Background Art

In recent years, semiconductor devices have been miniaturized and increased in capacity and speed, resulting in an increase in the number of devices formed therein. This has increased the influence of the device defective portions on manufacturing yield. Therefore, to ensure adequate manufacturing yield, many semiconductor devices have a redundant circuit configuration in which a plurality of spare (or redundant) memory cells are formed among ordinary memory cells.

With this arrangement, if a memory cell is found to include a defective bit, the defective bit is replaced by a spare memory cell (provided beforehand) to salvage the semiconductor device. One widely used method for replacing a defective bit by a spare memory cell is known as laser trimming, which cuts off a wiring layer(s) (functioning as a fuse) by use of a laser beam.

If laser trimming is applied to a semiconductor device structure in which wiring such as signal wiring and power supply wiring and internal devices such as transistors are formed in the layers under the fuses, these internal devices may be damaged when a fuse is blown by the laser beam. Therefore, semiconductor devices are often configured such that the region right under fuses and regions therearound have no devices other than fuses formed therein.

Further, to prevent defects due to a fuse blow by laser trimming, a method for blowing a fuse is proposed which applies a plurality of different wavelength laser beams to fuse wiring having a multilayer structure (see, e.g., Japanese Laid-Open Patent Publication No. 2002-134616).

However, as described above, in the above structure that no devices other than fuses are formed in the regions right under fuses and regions therearound, which means that these regions are available only for formation of fuses. This may restrict miniaturization of semiconductor devices. To address this problem, a blocking layer may be provided right under the region in which fuses are formed in order to block the laser beam. Since this blocking layer does not allow the laser beam to pass, devices can be formed in the regions under the blocking layer.

Incidentally, in general, the fuses and wiring in the same layer are formed at once. This means that the fuses may be formed of the same material as the wiring (copper, etc.). However, copper, for instance, has low laser light absorptivity. A high energy laser beam is needed to cut off a fuse formed of a material having low laser light absorptivity (such as copper). When the above blocking layer (for blocking a laser beam) is irradiated with such a high energy laser beam, however, the layer may melt and hence the laser beam may reach layers under the blocking layer.

Further, with the miniaturization of semiconductor devices, the distances between the fuses have decreased. Therefore, when blowing a fuse by laser irradiation, it is necessary to prevent the adjacent fuses from being accidentally blown. Further, the opening formed as a result of blowing a fuse may reach the oxide film on an adjacent fuse or even the adjacent fuse itself, exposing them. In such a case, the exposed adjacent fuse (made of metal) may corrode, resulting in an electrical disconnection.

SUMMARY OF THE INVENTION

The present invention has been devised to solve the above problems. It is, therefore, an object of the present invention to provide a miniaturized semiconductor device to which laser trimming can be reliably applied. Another object of the present invention is to provide a method for manufacturing such a semiconductor device.

According to one aspect of the present invention, a semiconductor device comprises a substrate, a first insulating film formed on a principal surface of the substrate, a second insulating film formed on the first insulating film, a fuse insulating film formed on the second insulating film, a plurality of fuses formed in the fuse insulating film, and a blocking layer formed of a material capable of reflecting laser light irradiated to blow the plurality of fuses. The blocking layer is disposed in the first and second insulating films such that the blocking layer overlaps a region in which the plurality of fuses are formed when viewed from the principal surface of the substrate.

According to another aspect of the present invention, a semiconductor device comprises a substrate, a third insulating film formed on the substrate, a fourth insulating film formed on the third insulating film, and a plurality of fuses each disposed in the third and fourth insulating films.

According to another aspect of the present invention, in a method for manufacturing a semiconductor device, a first insulating film is formed on a principal surface of a substrate, and a second insulating film is formed on the first insulating film. A blocking layer is formed in the first and the second insulating films. The fuse insulating film is formed on the second insulating film in which the blocking layer is formed. A plurality of fuses are formed in the fuse insulating film. The blocking layer is formed of a material capable of reflecting laser light irradiated to blow the plurality of fuses. The plurality of fuses are formed such that a region in which the plurality of fuses are formed overlaps a region in which the blocking layer is formed when viewed from the principal surface of the substrate.

According to another aspect of the present invention, in a method for manufacturing a semiconductor device, a third insulating film is formed on a principal surface of a substrate a fourth insulating film is formed on the third insulating film. A fuse is formed in the third and fourth insulating films.

Other and further objects, features and advantages of the invention will appear more fully from the following description.

DETAILED DESCRIPTION OF THE PREFERRED EMBODIMENTS

Preferred embodiments of the present invention will be described with reference to the accompanying drawings. It should be noted that like numerals will be used to denote like or corresponding components to avoid undue repetition.

In the following description of preferred embodiments, details are set forth, such as specific configurations, process steps, quantities, amounts, ranges, etc. in order to provide a thorough understanding of the present invention. It is to be understood, however, that these specific details should not be construed as restrictive unless explicitly so stated or so dictated by a principle.

First Embodiment

Figure 1:
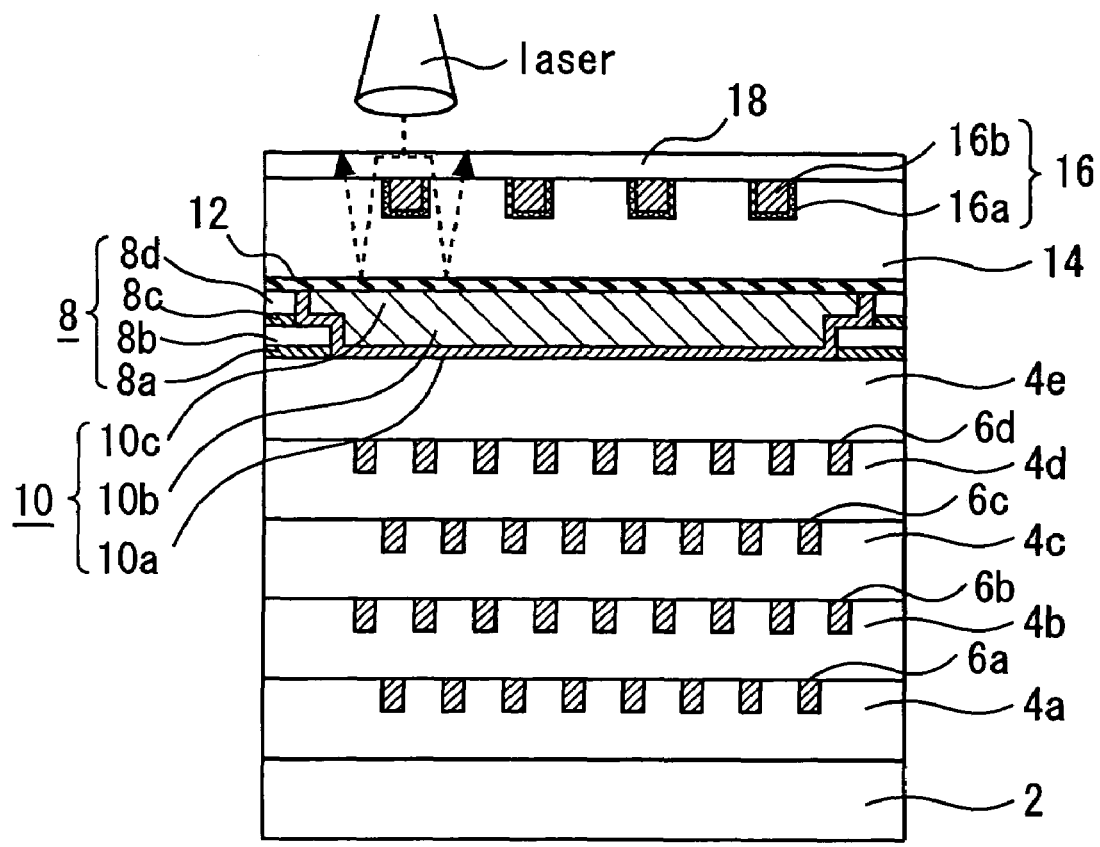
FIGS. 1 and 2 are schematic diagrams illustrating a semiconductor device according to a fist embodiment of the present invention.
Figure 2:
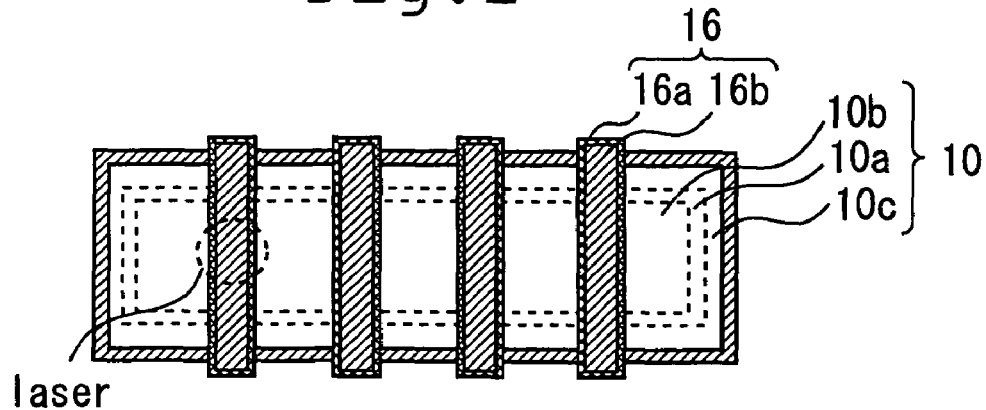

FIGS. 1 and 2 are schematic diagrams illustrating a semiconductor device according to a fist embodiment of the present invention. Specifically, these figures show enlarged views of the fuse region and the regions surrounding it in the semiconductor device. FIG. 1 is a cross-sectional view of these regions taken along a plane perpendicular to the Si substrate surface, while FIG. 2 is a plan view showing only the copper fuses and copper reflector.

Referring to FIG. 1, a plurality of multilayered wiring layers are formed over an Si substrate 2. Specifically, interlayer insulating films 4a to 4d are laminated to one another over the Si substrate 2. These interlayer insulating films (4a to 4d) have copper wires 6a to 6d, respectively, formed therein. Further, an interlayer insulating film 4e is formed on the top interlayer insulating film 4d. No wires are formed within at least the portion under the fuse region as shown in FIG. 1.

Further, an insulating film 8 made up of four laminated layers is formed on the interlayer insulating film 4e. Specifically, the insulating film 8 is made up of a silicon nitride film 8a, a silicon oxide film 8b, a silicon nitride film 8c, and a silicon oxide film 8d laminated to one another in that order. The silicon nitride film 8a and the silicon oxide film constitute one layer of interlayer insulating films and the silicon nitride film 8c and silicon oxide film constitute another layer of interlayer insulating films. The silicon nitride film 8a, the silicon oxide film 8b, the silicon nitride film 8c, and the silicon oxide film 8d have thicknesses of, for example, 50 nm, 200 nm, 50 nm, and 200 nm, respectively.

A copper reflector 10 is formed in an opening that extends in the insulating film 8. This opening passes through the silicon nitride film 8a, the silicon oxide film 8b, and the silicon nitride film 8c and silicon oxide film 8d. The copper reflector 10 is made up of a barrier film 10a, a connection layer 10b, and a copper wire 10c. The thickness of the entire copper reflector 10 is, for example, 500 nm.

The barrier film 10a is a thin film formed in contact with the inner wall of the opening for forming the copper reflector in the insulating film 8. The barrier film 10a is formed of a film stack of tantalum nitride and tantalum, or formed of tantalum nitride, for example.

The connection layer 10b is made up of copper formed on the barrier film 10a so as to fill the opening formed in the silicon nitride film 8a and in the silicon oxide film 8b.

The copper wire 10c is in contact with the connection layer 10b and made up of copper so as to fill the opening formed in the silicon nitride film 8c and in the silicon oxide film 8d. On the portion between the copper wire 10c and the silicon nitride film 8c or the silicon oxide film 8b or 8d, the barrier film 10a is formed.

A diffusion blocking film 12 is formed on the insulating film 8 and on the copper reflector 10 formed in the insulating film 8. The diffusion blocking film 12 prevents copper from diffusing from the copper reflector 10. The diffusion blocking film 12 is, for example, an insulating film such as a silicon nitride film or a carbon-doped silicon nitride film.

A lower fuse insulating film 14 is formed on the diffusion blocking film 12. The thickness of the entire lower fuse insulating film 14 is, for example, 200 nm.

Referring to FIGS. 1 and 2, four parallel openings are formed in the surface portion of the lower fuse insulating film 14 above the copper reflector 10. Copper fuses 16 are formed by forming copper 16b on a barrier film 16a on the openings so as to fill these openings.

Further, an upper fuse insulating film 18 is formed on the lower fuse insulating film 14 and on the copper fuses 16. The upper fuse insulating film 18 is made up of a silicon nitride film.

When laser trimming is performed on the copper fuses 16, the wavelength of the laser beam is often set to approximately between 1.0 μm and 1.3 μm (a near-infrared wavelength). The reflectance of laser light with such a wavelength incident on a copper surface is 99% or more; that is, the surface of the copper reflector 10 reflects almost all of this incident light.

However, when the fuses are formed of copper as in the semiconductor device of the present embodiment, reliably blowing them by laser trimming requires a laser beam with high light intensity.

In such a case, if the copper reflector 10 is made up of only a single thin layer (as are the wiring layers formed in other regions of the silicon nitride film 8c and the silicon oxide film 8d), that is, if the copper reflector 10 is made up of only the copper wire 10c, then the copper reflector 10 may melt due to the heat generated as a result of absorbing a small portion of the irradiated high energy laser beam. This might lead to melting of the copper wires 6d to 6a under the copper reflector 10.

However, according to the present embodiment, the copper reflector 10 is actually made up of the copper wire 10c and the connection layer 10b, which is formed under the copper wire 10c and in the insulating film 8 (that is, in the silicon nitride film 8a and in the silicon oxide film 8b). As a result, the entire copper reflector 10 has larger thickness and hence larger heat capacity, which prevents the copper reflector 10 from melting. Therefore, in the semiconductor device of the first embodiment, wires such as multilayered wiring layers 6a to 6d (functioning as signal wires, etc.) and devices such as transistors (not shown) can be formed under the copper reflector 10 below the fuse region.

Figure 3:
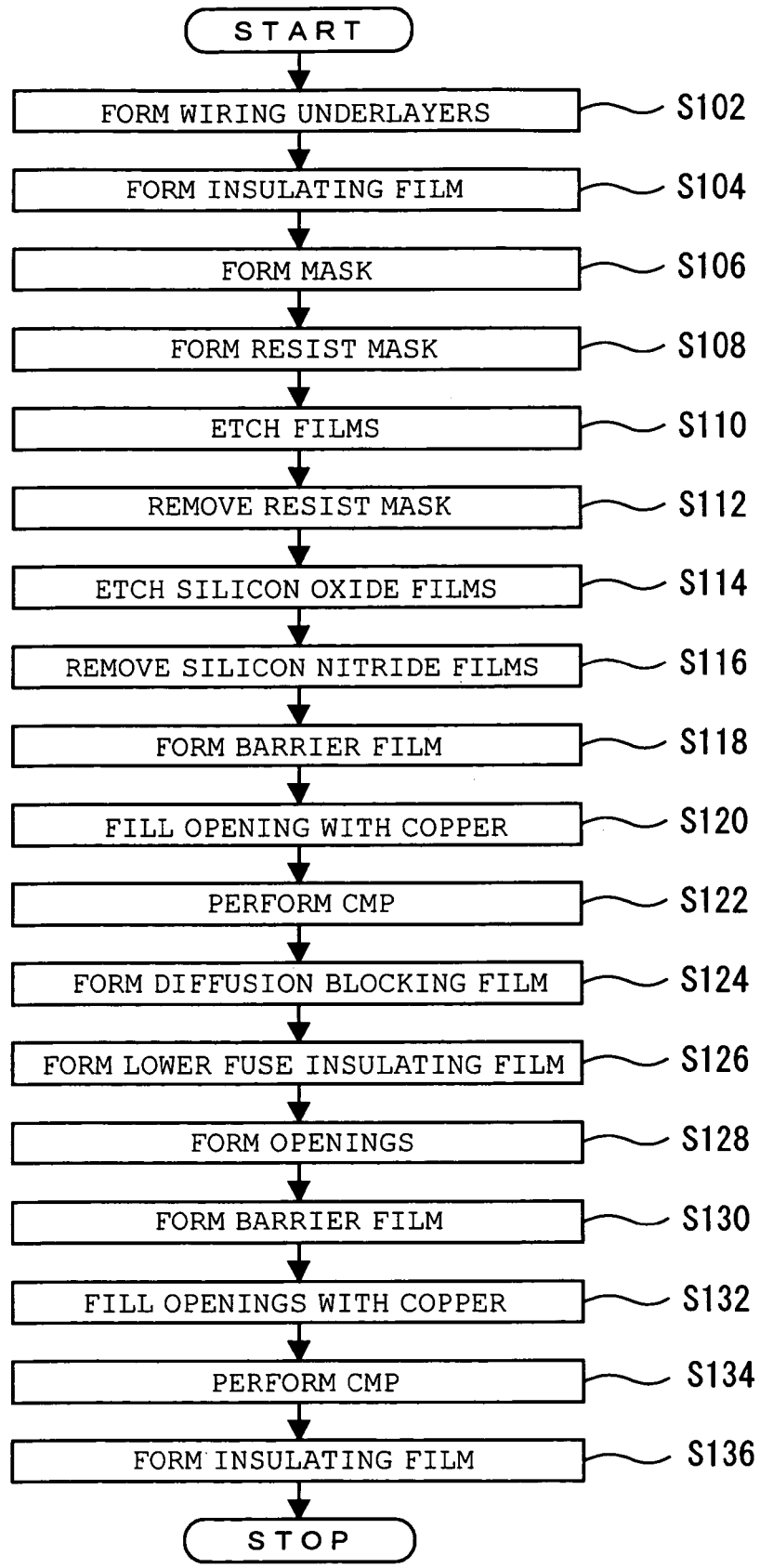
FIG. 3 is a flowchart illustrating a method for manufacturing a semiconductor device according to the first embodiment of the present invention.

FIG. 3 is a flowchart illustrating a method for manufacturing a semiconductor device according to the first embodiment. FIGS. 4 to 9 are schematic cross-sectional diagrams illustrating each step of the method for manufacturing a semiconductor device according to the first embodiment. It should be noted that the cross sections shown in FIGS. 4 to 9 correspond to the cross section shown in FIG. 1.

First of all, at step S102, the necessary internal devices such as the interlayer insulating films 4a to 4d and the copper wires 6a to 6d are formed over the Si substrate 2, and then the interlayer insulating film 4e is formed on the interlayer insulating film 4d. Then, the silicon nitride film 8a, the silicon oxide film 8b, the silicon nitride film 8c, and the silicon oxide film 8d are formed over the interlayer insulating film 4e in that order at step S104.

Figure 4:
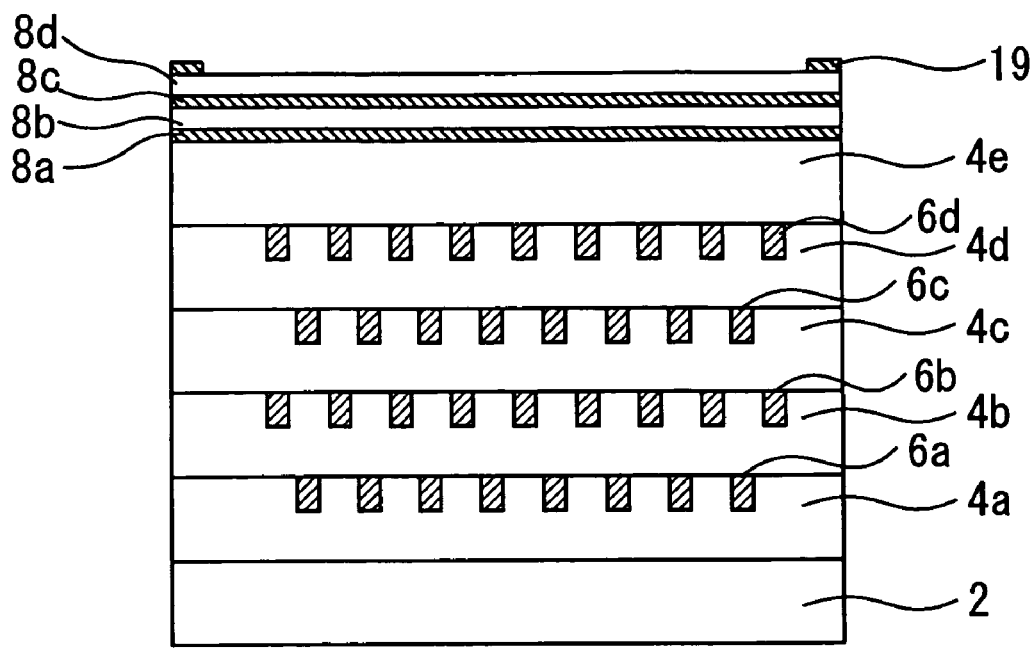
FIGS. 4 to 9 are schematic cross-sectional diagrams illustrating each step of the method for manufacturing a semiconductor device according to the first embodiment of the present invention.

Then, at step S106, a silicon nitride film 19 is formed on the silicon oxide film 8d as a mask so as to define the width dimension of the copper wire 10c of the reflector layer 10, as shown in FIG. 4. Specifically, after forming the silicon nitride film, it is etched to form an opening having a dimension matching the width dimension of the copper wire 10c. This opening may be formed by a lithographic technique and etching. The etching is performed under such conditions that a sufficient etching selectivity ratio can be achieved against the silicon oxide film 8d under the silicon nitride film 19.

Figure 5:
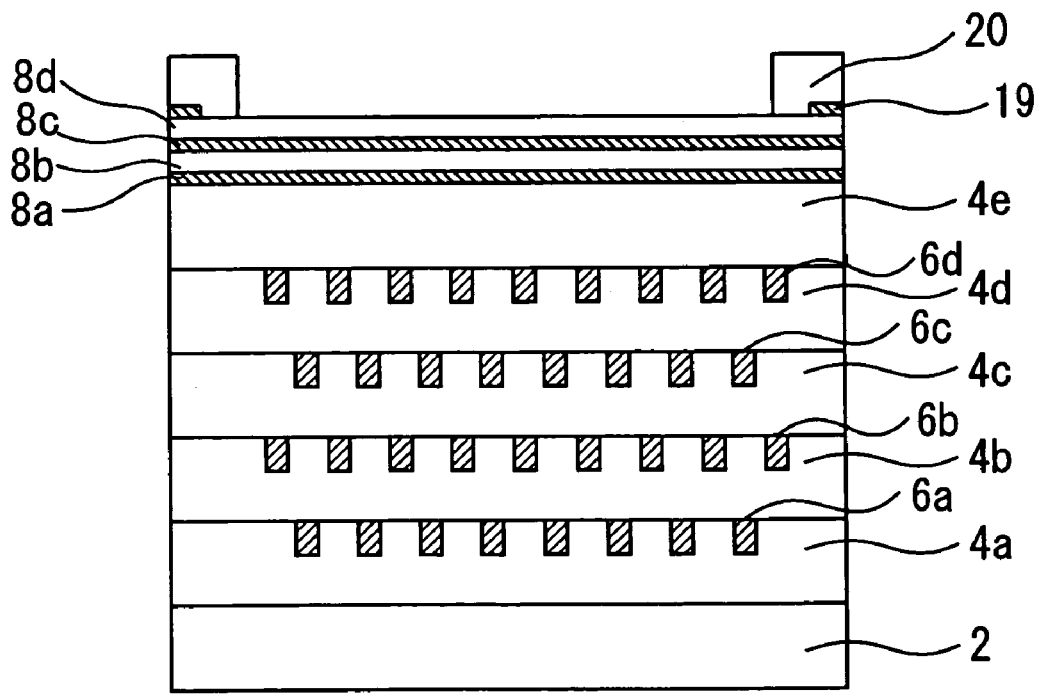

Then, at step S108, a resist mask 20 is formed on the silicon oxide film 8d such that the silicon nitride film 19 is buried under the resist mask 20, as shown in FIG. 5. The resist mask 20 has an opening at the position corresponding to the connection layer 10b and may be formed by a lithographic technique, etc.

Figure 6:
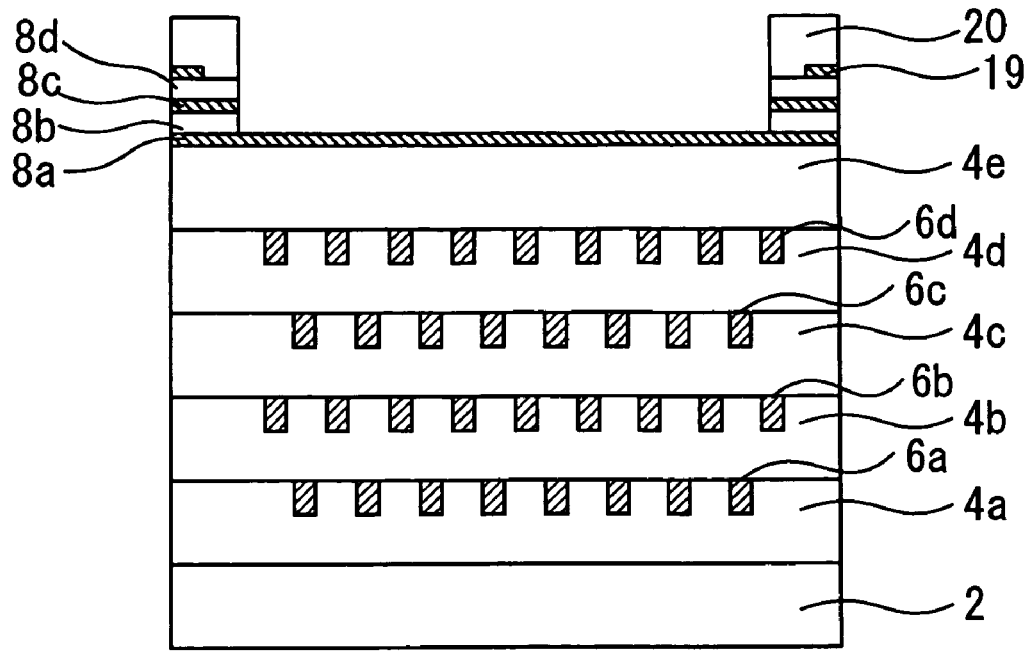

Then, at step S110, the silicon oxide film 8d, the silicon nitride film 8c, and the silicon oxide film 8b are etched using the resist mask 20, as shown in FIG. 6. It should be noted that the silicon oxide film 8b (the lowest one of these films) is etched under such conditions that a sufficient etching selectivity ratio can be achieved against the silicon nitride film 8a. This etching is stopped when the top of the silicon nitride film 8a has been reached. After that, the resist mask 20 is removed at step S112.

Figure 7:
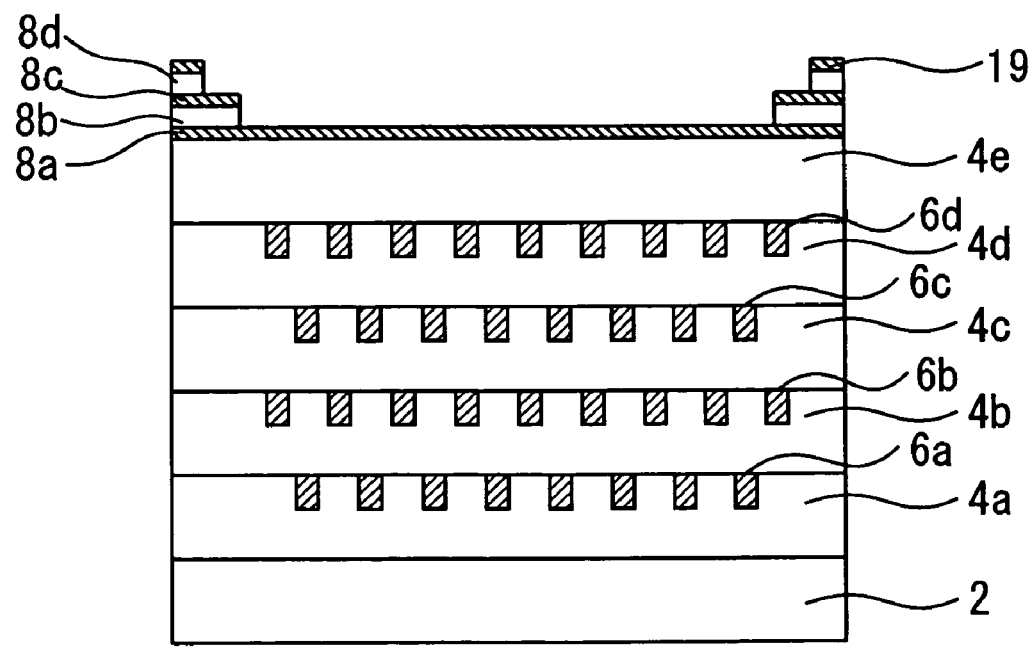

Then, at step S114, the silicon oxide films is etched using the silicon nitride film 19 as a mask, as shown in FIG. 7. This etching is performed under such conditions that a sufficient etching selectivity ratio can be achieved against the silicon nitride films 8a and 8c. Therefore, while etching the silicon oxide film 8d, the silicon nitride films 8c are used as mask for the silicon oxide film 8b.

Then, the silicon nitride films 19 and the exposed portions of the silicon nitride films 8c and 8a are removed at step S116, forming an opening for forming a copper reflector 10 that extends through the insulating film 8 in the depth direction.

Then, a barrier film 10a is formed on the surface of the opening at step S118. The barrier film 10a is formed of tantalum nitride, etc.

Figure 8:
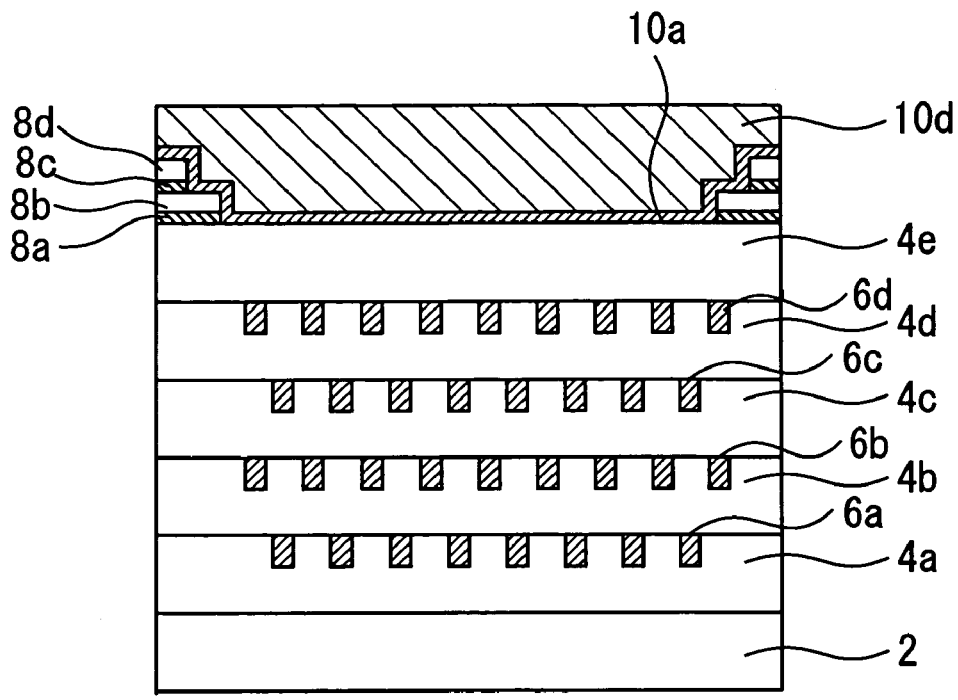

After that, at step S120, copper 10d is formed so as to fill the opening, as shown in FIG. 8. Then, at step S122, planarization is carried out by CMP (Chemical Mechanical Polishing) such that at least the surface of the silicon oxide film 8d is exposed, forming the copper reflector 10. It should be noted that necessary copper wires and connection layers are formed in other regions at the same time as the above formation of the copper reflector 10.

Figure 9:
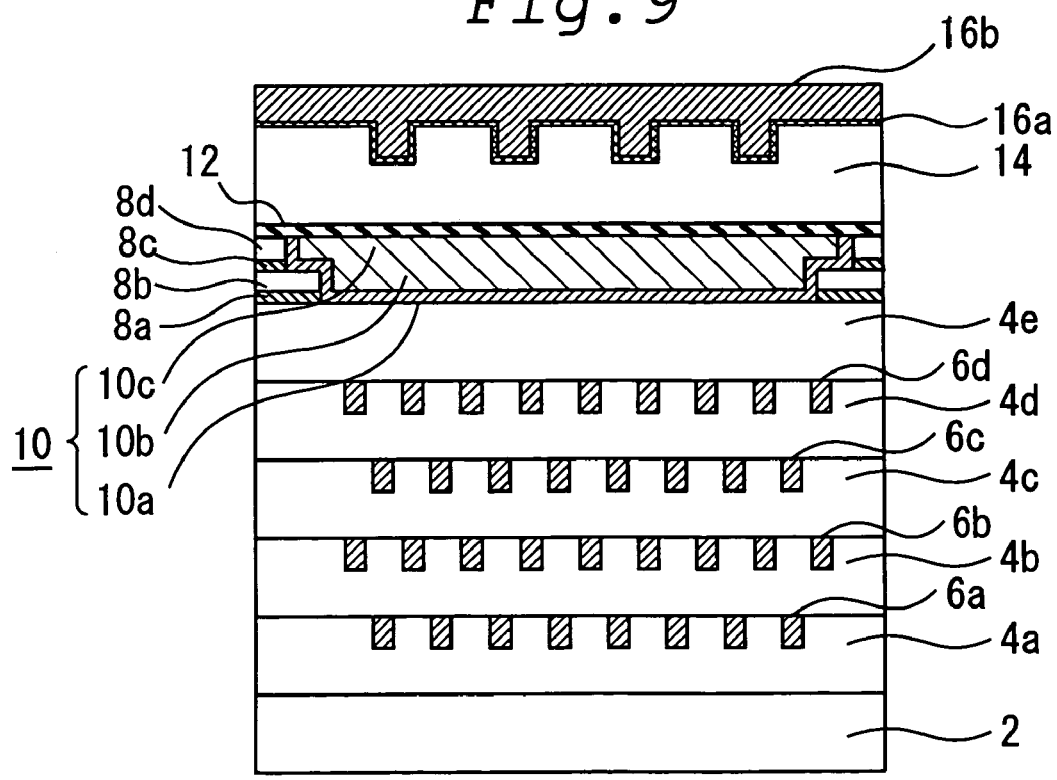

Referring now to FIG. 9, a silicon nitride film is formed as the diffusion blocking film 12 at step S124. Further, a silicon oxide film is formed as the lower fuse insulating film 14 at step S126.

Then, at step S128, openings for forming fuses are formed in the positions within the lower fuse insulating film 14 where the copper fuses 16 are formed. Specifically, as conventionally done in the art, after forming a resist mask by a lithographic process and a developing process, etc., the lower fuse insulating film 14 is etched using this mask. This etching is stopped when a desired depth for the copper fuses has been reached.

Then, a barrier film 16a is formed on the exposed surfaces including the inner walls of the openings, at step S130. Further, copper 16b is formed so as to fill the openings at step S132. After that, at step S134, planarization is carried out by CMP (Chemical Mechanical Polishing) until the surface of the lower fuse insulating film 14 is exposed, forming the copper fuses 16 in the surface portion of the lower fuse insulating film 14.

Then, the upper fuse insulating film 18 is formed over the surfaces of the lower fuse insulating film 14 and the copper fuses 16 at step S136. The upper fuse insulating film is a silicon oxide film.

This completes formation of the semiconductor device shown in FIG. 1.

As described above, according to the present embodiment, the copper reflector 10 is formed right under the region in which the copper fuses 16 are formed. It should be noted that the copper reflector 10 is formed so as to extend through the silicon oxide film 8d, the silicon nitride film 8c, the silicon oxide film 8b, and the silicon nitride film 8a (constituting the insulating film 8) in the depth direction. This means that the copper reflector 10 of the present embodiment (made up of the barrier film 10a, the connection layer 10b, and the copper wire 10c) has large thickness and hence large heat capacity, as compared to when it is made up of only a single layer. Therefore, when a copper fuse 16 is blown, the copper reflector 10 can be prevented from melting even if it absorbs a portion of the irradiated high energy laser beam. Furthermore, the copper reflector 10 can reflect 99% of the laser beam, which prevents the laser beam irradiation from affecting the underlayer wires 6d to 6a, as well as preventing melting of these wires due to melting of the copper reflector 10. As a result, it is possible to blow the fuses without reducing the reliability of the semiconductor device, resulting in increased manufacturing yield.

It should be noted that according to the present embodiment, the copper reflector 10 is formed in both the silicon oxide film 8b and the silicon oxide film 8d with two silicon nitride film 8a and 8c. However, the present invention is not limited to this particular arrangement. The copper reflector 10 may be formed in any insulating film having two or more layers. That is, the copper reflector 10 may be any wire made up of at least a copper wire portion and a connection portion.

Since the copper wire 10c (used as a reflector) and the actual conductive copper wires in other regions are formed at once, the thickness of the copper wire 10c depends on that of the actual conductive copper wires, meaning that the copper wire 10c has a relatively small thickness. However, since the entire copper reflector 10 is made up of the copper wire 10c and the connection layer 10b formed under the copper wire 10c, the copper reflector 10 is formed in two (or more) insulating layers and hence has required thickness. Even though in the semiconductor device of the present embodiment the copper reflector 10 is formed in the two layers of silicon oxide films 8b and 8d (so as to extend through the four layers 8a to 8d of the insulating film 8), the present invention is not limited to this particular arrangement. The copper reflector 10 may be formed in an insulating film having three or more layers if a sufficient thickness can be ensured.

To form the opening in which the copper reflector 10 is formed, the first embodiment uses the following steps: forming the silicon nitride film 19 (to be used as a mask) on the silicon oxide film 8d; forming the resist mask 20; etching the silicon oxide film 8d, the silicon nitride film 8c, and the silicon oxide film 8b using the resist mask 20; and etching the silicon oxide films 8d using the silicon nitride film 19 as a mask. However, the present invention is not limited to this particular method. Other methods may be used to form the opening.

Further, even though the first embodiment forms the copper reflector 10 by filling the above opening with copper at once (a dual damascene technique), the present invention is not limited to this particular method. For example, the copper reflector 10 may be formed by a single damascene technique using the following steps: forming an opening for the connection layer 10b in the silicon oxide film 8b and in the silicon nitride film 8a; filling this opening with copper to form the connection layer 10b; forming the silicon nitride film 8c and the silicon oxide film 8d on the top surfaces; forming an opening for the copper wire 10c in the silicon nitride film 8c and in the silicon oxide film 8d; and filling this opening with copper to form the copper wire 10c.

Second Embodiment

Figure 10:
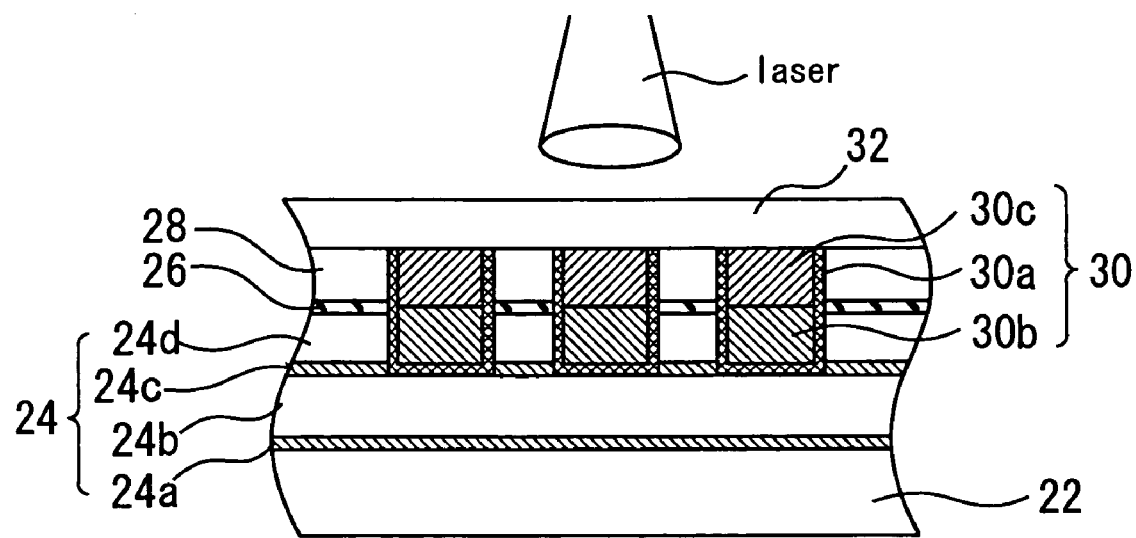
FIGS. 10 and 11 are schematic diagrams illustrating a semiconductor device according to a second embodiment of the present invention.
Figure 11:
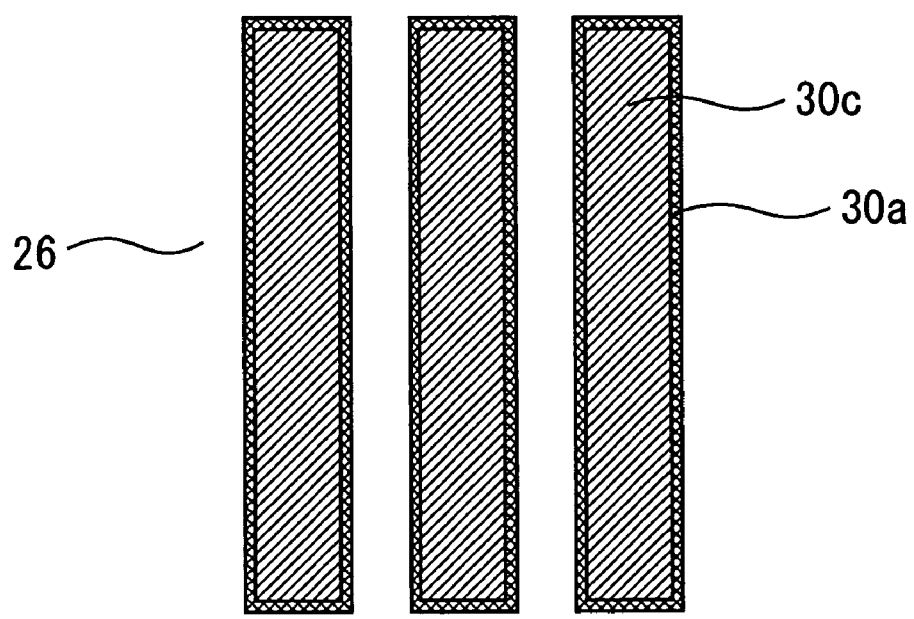

FIGS. 10 and 11 are schematic diagrams illustrating a semiconductor device according to a second embodiment of the present invention. FIG. 10 is an enlarged cross-sectional view of the fuse region and the regions surrounding it in the semiconductor device taken along a plane perpendicular to the Si substrate. FIG. 11 is a plan view showing only the copper fuses.

In the semiconductor device of the second embodiment, the insulating film 24, the silicon nitride film 26, and the silicon oxide film 28 are laminated to one another over a substrate 22 in that order, as shown in FIGS. 10 and 11. The insulating film 24 is made up of a silicon nitride film 24a, a silicon oxide film 24b, a silicon nitride film 24c, and a silicon oxide film 24d laminated to one another. The insulating film 24, the silicon nitride film 26, and the silicon oxide film 28 have thicknesses of, for example, 2.5 μm, 50 nm, and 200 nm, respectively. Further, though not shown, internal devices such as multilayer wiring and transistors are formed on the substrate 22.

Further, copper fuses 30 are formed so as to extend in the silicon oxide film 28, the silicon nitride film 26, and the insulting film 24. Specifically, these fuses are formed as follows. First, openings are formed so as to extend through the silicon oxide film 28 and the silicon nitride film 26 into the insulating film 24. Then, after forming a barrier film 30a on the inner walls of the openings, copper is formed on the barrier film 30a so as to fill the openings. That is, each copper fuse 30 is made up of: a connection layer 30b formed in the insulating film 24 through a barrier film 30a; and a copper wire 30c formed in the silicon nitride film 26 and in the silicon oxide film 28 through a barrier film 30a so as to extend through the film in the depth direction. The connection layer 30b and the copper wire 30c have a thickness of, for example, 250 nm. It should be noted that, though not shown, actual conductive wires are formed in other regions of the layer in which the copper wires 30c are formed (that is, the silicon oxide film 28 and the silicon nitride film 26). These actual conductive wires and the copper wires 30c are formed at once.

The width of each copper fuse 30 (that is, the lateral dimension of each copper fuse 30 in FIGS. 10 and 11) is 0.6 μm and the space between two adjacent copper fuses 30 is 3.4 μm; that is, the pitch, or the center to center distance, between two adjacent copper fuses 30 is 4.0 μm.

An insulating film 32 is formed on the silicon oxide film 28 and on the copper fuses 30.

In the semiconductor device of the second embodiment configured as described above, each of the copper fuse 30 includes: the copper wire 30c formed in a region of the silicon oxide film 28 and the silicon nitride film 26 (actual conductive wires are formed in other regions of this film); and the connection layer 30b formed under the copper wire 30c so as to extend through the silicon oxide film 24d and the silicon nitride film 24c. Thus, each copper fuse 30 is formed so as to extend in a plurality of insulating film in the depth direction and hence has a large thickness or depth. This arrangement prevents the opening formed due to blowing of the copper fuse 30 from spreading to the adjacent fuses.

That is, if the fuse has a small thickness (e.g., a thickness of approximately 250 nm, which is approximately equal to the thickness of the ordinary copper wires), the upward pressure and the sideward pressure generated due to blowing of the fuse have approximately the same magnitude. This means that the overall fuse blow pressure is nondirectional and hence the opening formed due to the fuse blow spreads in the lateral direction.

However, according to the second embodiment, each copper fuse 30 is made up of two layers (namely, the connection layer 30b and the copper wire 30c) and hence has a large thickness, or depth, (500 nm). When a fuse has a large thickness, as in this case, the upward pressure generated as a result of blowing the fuse is considered to be larger than the sideward pressure. This means that the overall fuse blow pressure can be directed upward to reduce the lateral dimension of the opening formed due to the fuse blow if the fuse has two (or more) layers and hence has a large thickness. Even though the pitch, or the center to center distance, between two adjacent copper fuses 30 in the fuse region of the semiconductor device is small (approximately 4 μm), the above arrangement allows a target copper fuse 30 to be selectively blown.

Figure 12:
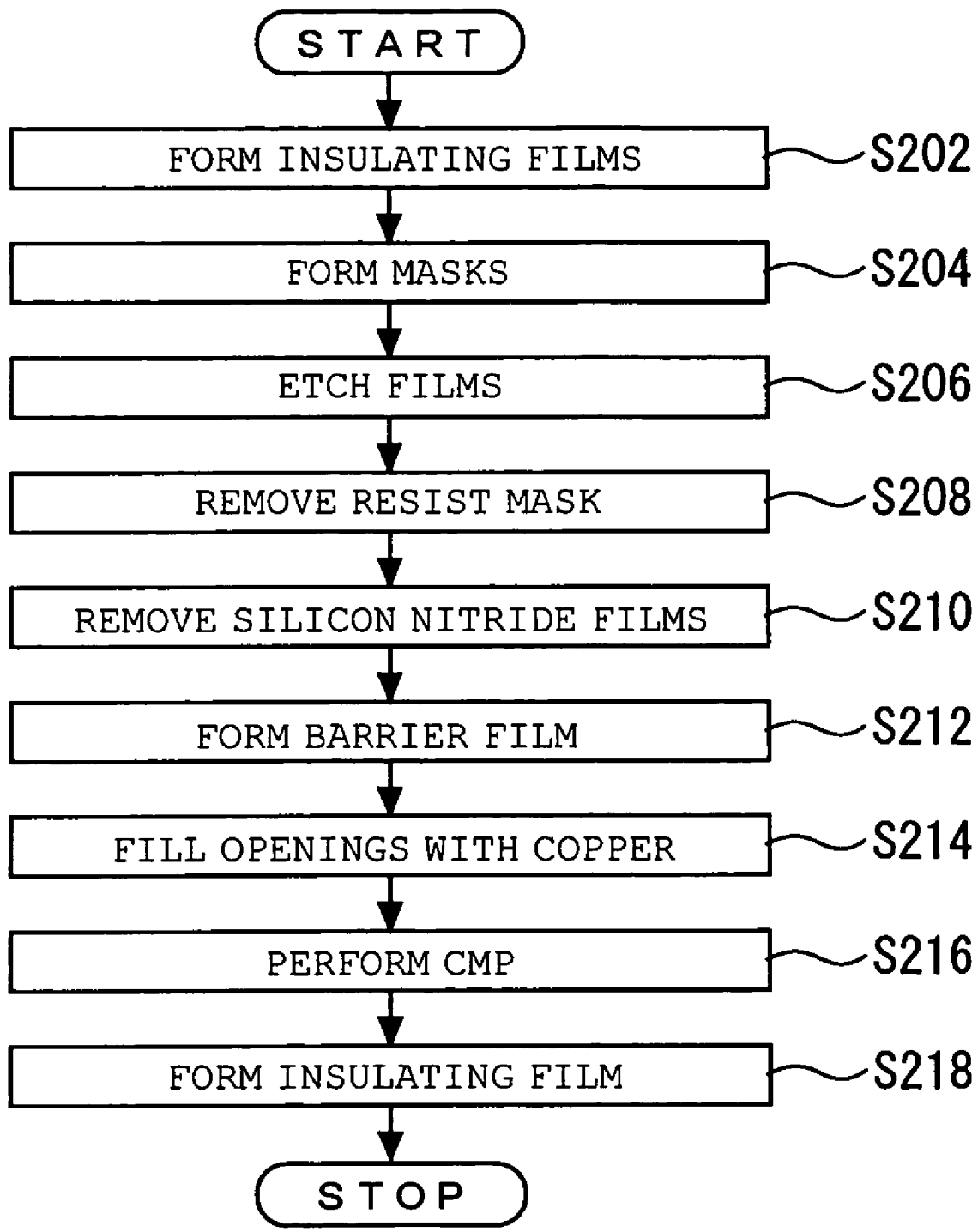
FIG. 12 is a flowchart illustrating a method for manufacturing a semiconductor device according to the second embodiment of the present invention.
Figure 13:
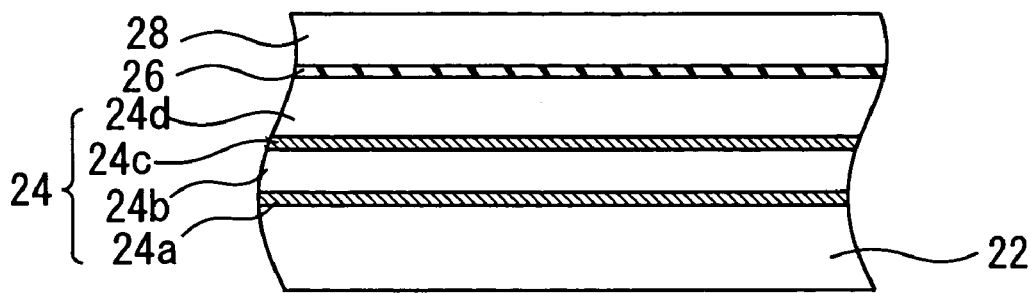
FIGS. 13 to 15 are schematic diagrams illustrating each step of the method for manufacturing a semiconductor device according to the second embodiment of the present invention.
Figure 14:
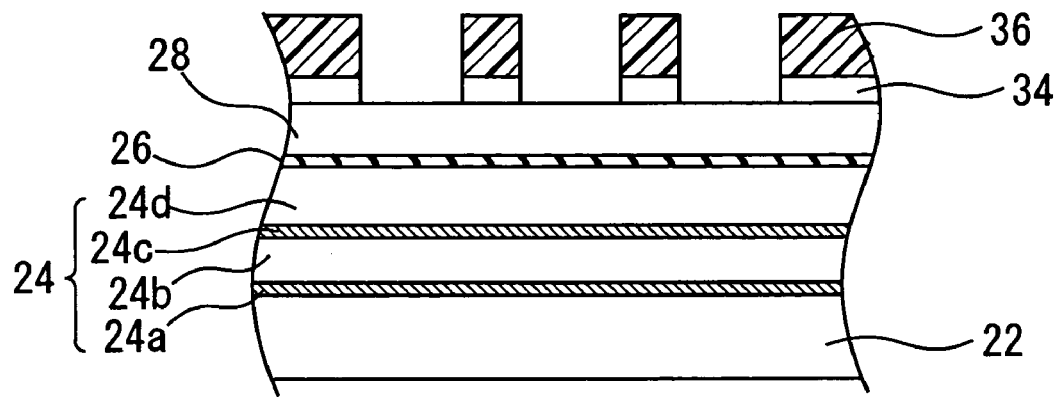
Figure 15:
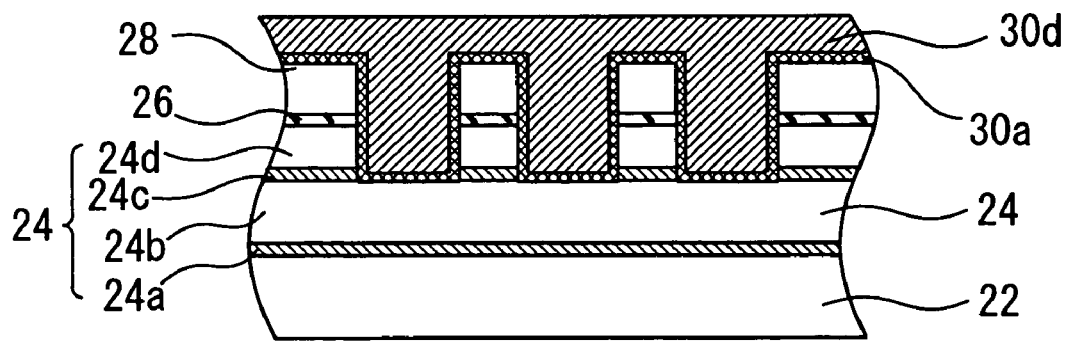

FIG. 12 is a flowchart illustrating a method for manufacturing a semiconductor device according to the second embodiment. FIGS. 13 to 15 are schematic diagrams illustrating each step of the method for manufacturing a semiconductor device according to the second embodiment.

There will now be described the method for manufacturing a semiconductor device according to the second embodiment with reference to FIGS. 12 to 15.

First of all, at step S202, the silicon nitride film 24a, the silicon oxide film 24b, the silicon nitride film 24c, and the silicon oxide film 24d (collectively constituting the insulating film 24) are laminated to one another over the substrate 22 in that order. Note that the necessary transistors, multilayered wiring layers, etc. are formed on the substrate 22 before this step. Then, also at step S202, the silicon nitride film 26 and the silicon oxide film 28 are formed over the insulating film 24, as shown in FIG. 13.

Then, at step S204, a mask 34 formed of a silicon nitride film 34 and a resist mask 36 are formed over the silicon oxide film 28. Specifically, after forming the silicon nitride film, the resist mask 36 having openings at the positions corresponding to the copper fuses 30 is formed on the silicon nitride film 34 by use of a lithographic technique. Then, the silicon nitride film 34 is etched using the resist mask 36 to form the mask of the silicon nitride film 34, as shown in FIG. 14.

Then, the silicon oxide film 28, the silicon nitride film 26, and the silicon oxide film 24d are etched using the resist mask 36 and the mask of the silicon nitride film 34 at step S206. It should be noted that the silicon oxide film 24d is etched under such conditions that a sufficient etching selectivity ratio can be achieved against the silicon nitride film 24c, and this etching is stopped when the silicon nitride film 24c has been reached.

Then, the resist mask 36 is removed at step S208 and the silicon nitride film 34 and the exposed portions of the silicon nitride film 24c are removed at step S210, forming the openings in which the copper fuses 30 are formed.

Then, at step S212, by using a sputtering technique, a barrier film 30a is formed on the inner wall of each opening in which a fuse is formed. Further, at step S214, copper 30d is formed on the barrier film 30a so as to fill the openings, as shown in FIG. 15. After that, at step S216, planarization is carried out by CMP until at least the surface of the silicon oxide film 28 is exposed.

Then, the insulating film 32 is formed on the silicon oxide film 28 and on the copper fuses 30 at step S218, forming the semiconductor device structure shown in FIGS. 10 and 11.

As described above, according to the second embodiment, each copper fuse 30 extends through the silicon oxide film 28 and the silicon nitride film 26 and further extends halfway into the insulating film 24. (Note that actual conductive copper wires are formed only in the silicon oxide film 28.) That is, the copper fuses 30 have a larger thickness than the actual conductive copper wires (formed in other regions). Thus, since the copper fuses 30 have larger thickness, the pressure generated due to blowing of the copper fuse 30 is directed upward, allowing the size of the opening formed due to the fuse blow to be reduced. As a result, it is possible to reliably blow only the target copper fuse 30 and thereby prevent the surfaces of the adjacent copper fuses 30 from being exposed due to the opening formed by the fuse blow, allowing the semiconductor device to have good characteristics.

To form the copper fuses 30, the second embodiment uses the following steps: laminating the insulating film 24, the silicon nitride film 26, and the silicon oxide film 28 to one another in that order; forming openings extending in these films; and filling these openings with copper at once to form the copper fuses 30. However, the present invention is not limited to this particular copper fuse forming method. Other methods may be used to form the copper fuses 30. For example, each copper fuse 30 made up of a connection layer 30b and a copper wire 30c may be formed using the following steps: forming the connection layer 30b in an underlayer insulating film; forming an upper layer insulating film on the underlayer insulating film; and forming the copper wire 30c in the upper layer insulating film.

According to the present embodiment, each copper fuse 30 is made up of two layers (namely, a copper wire 30c and a connection layer 30b). However, the present invention can be applied to any copper fuse that is formed so as to extend in a plurality of insulating films and that hence has large thickness, with the same effect. That is, the copper fuse may have three layers and extend in a plurality of insulating films.

Further according to the second embodiment, the fuses are formed of copper. However, the present invention is not limited to copper fuses, and other materials may be used. The material for the fuses may be determined by taking into account the material of the actual conductive wires formed in other regions.

Further according to the second embodiment, ordinary multilayered wiring layers are formed in the layers under the fuses. However, the present invention is not limited to this particular arrangement. No wires and internal devices may be formed in these regions. Further, the copper reflector 10 as described in connection with the first embodiment may be formed in the region in which fuses 30 are formed. This allows for reflection of the laser beam applied to blow a copper fuse, thus preventing damage to the underlayer due to the fuse blow. When the copper reflector 10 (of the first embodiment) is additionally formed in the semiconductor device of the second embodiment, the insulating film 8 of the first embodiment may be formed under the insulating film 24 of the second embodiment, for example. Therefore, the copper reflector 10 may be formed under the copper fuse 30 in the insulating film 24. More specifically, the silicon nitride layer 8a, the silicon oxide layer 8b, the silicon nitride layer 8c and silicon oxide layer 8d are formed to one another over the Si substrate 22. The connection layer 10b may be formed in the silicon nitride film 8a and in the silicon oxide film 8b, and the copper wire 10c may be formed in the silicon nitride film 8c and in the silicon oxide film 8d. The insulating film 24 is formed on the silicon oxide film 8d.

It should be noted that, for example, the Si substrate 2, the copper fuses 16, the reflector layer 10 of the first embodiment correspond to the substrate, the fuses, and the blocking layer described in the appended claims, respectively. The silicon nitride film 8a and the silicon oxide film 8b together correspond to the first insulating film described in the appended claims. The silicon nitride film 8c and silicon oxide film 8d together correspond to the second insulating film described in the appended claims. The lower fuse insulating film 14 corresponds to the fuse insulating film described in the appended claims.

Further, for example, the substrate 22, the insulating film 24, the silicon oxide film 28, and the copper fuses 30 of the second embodiment correspond to the substrate, the third insulating film, the fourth insulating film, and the fuses described in the appended claims, respectively.

Further, for example, execution of step S104 of the first embodiment corresponds to sequential execution of the first insulating film forming step and the second insulating film forming step described in the appended claims. Sequential execution of steps S106 to S122 and sequential execution of steps S124 to S134 correspond to the blocking layer forming step and the fuse forming step, respectively, described in the appended claims.

Further, for example, execution of step S202 of the second embodiment corresponds to sequential execution of the third insulating forming step and the fourth insulating forming step described in the appended claims, and sequential execution of steps S204 to S216 corresponds to execution of the fuse forming step described in the appended claims.

The features and the advantages of the present invention as described above may be summarized as follows.

According to one aspect of the present invention, in the semiconductor device, a blocking layer is formed under the fuse forming region so as to extend in two or more insulating films. Accordingly, the blocking layer has a larger thickness than the wires formed in other portions (of the layer in which the blocking layer is formed), preventing the laser beam for laser trimming from reaching the layers below the blocking layer. Therefore, it is possible to utilize the regions under the fuse region, allowing for miniaturization of the semiconductor device.

In another aspect, in the semiconductor device, fuses are formed so as to extend in two or more insulating films. Accordingly, these fuses have a larger thickness than the wires formed in other portions of one of the two or more insulating films, resulting in a reduction in the size of the opening formed due to a fuse blow. This allows the influence of the fuse blow to be limited to a narrow area. Therefore, it is possible to prevent such situations in which the opening formed due to blowing of a fuse spreads to the adjacent fuses and thereby exposes them.

Obviously many modifications and variations of the present invention are possible in the light of the above teachings. It is therefore to be understood that within the scope of the appended claims the invention may by practiced otherwise than as specifically described.

The entire disclosure of a Japanese Patent Application No. 2004-285816, filed on Sep. 30, 2004 including specification, claims, drawings and summary, on which the Convention priority of the present application is based, are incorporated herein by reference in its entirety.

The invention claimed is:

1. A semiconductor device comprising:
   a substrate;
   a first insulating film formed on a principal surface of said substrate;
   a second insulating film formed on said first insulating film;
   a fuse insulating film formed on said second insulating film;
   a plurality of fuses formed in said fuse insulating film;
   a blocking layer disposed in said first and second insulating films such that said blocking layer overlaps a region in which said plurality of fuses are formed when viewed from said principal surface of said substrate, said blocking layer being formed of a material capable of reflecting laser light irradiated to blow said plurality of fuses; and
   a compound film of nitride with silicon, the compound film disposed between the first insulating film and the second insulating film,
   wherein the blocking layer disposed in said first and second insulating films is also disposed in said compound film.

2. The semiconductor device according to claim 1, further comprising:
   one or more wiring layers formed between said blocking layer and said substrate, each wiring layer including an actual conductive wire.

3. The semiconductor device according to claim 1, wherein
   said fuse insulating film including two or more insulating film layers laminated to one another over said second insulating film, and
   said plurality of fuses are each formed at least in said two insulating film layers of said fuse insulating film.

4. The semiconductor device according to claim 1, wherein said blocking layer includes a layer formed of copper.

5. The semiconductor device according to claim 1, further comprising:
   a Cu wiring and a connecting layer formed in the first insulating film, the compound film and the second insulating film in a predetermined region, when viewed from the principal surface of the substrate, different from the region in which the plurality of fuses are formed,
   wherein each of the first and second insulating films is a silicon oxide film.

* * * * *